(12) United States Patent
Nonen et al.

(10) Patent No.: US 8,758,051 B2
(45) Date of Patent: Jun. 24, 2014

(54) CONNECTION STRUCTURE AND A CONNECTION METHOD FOR CONNECTING A DIFFERENTIAL SIGNAL TRANSMISSION CABLE TO A CIRCUIT BOARD

(75) Inventors: Hideki Nonen, Hitachi (JP); Takahiro Sugiyama, Hitachi (JP); Takashi Kumakura, Hitachinaka (JP)

(73) Assignee: Hitachi Metals, Ltd., Tokyo (JP)

( * ) Notice: Subject to any disclaimer, the term of this patent is extended or adjusted under 35 U.S.C. 154(b) by 160 days.

(21) Appl. No.: 13/373,043

(22) Filed: Nov. 3, 2011

(65) Prior Publication Data
US 2012/0061140 A1 Mar. 15, 2012

(30) Foreign Application Priority Data

Nov. 5, 2010 (JP) ................................. 2010-248452

(51) Int. Cl.
*H01R 13/40* (2006.01)

(52) U.S. Cl.
USPC ........................... 439/579; 439/479; 174/88 R (58) Field of Classification Search
USPC ............. 439/92, 98, 607.41–607.5; 174/88 R
See application file for complete search history.

(56) References Cited

U.S. PATENT DOCUMENTS 5,823,825 A * 10/1998 Murphy ...................... 439/607.5
6,380,485 B1 * 4/2002 Beaman et al. ............. 174/88 R
6,485,335 B1 * 11/2002 Dewdney .................... 439/607.5
7,727,021 B2 * 6/2010 Haruna et al. .............. 439/607.5
2008/0081499 A1 * 4/2008 Sumi et al. ..................... 439/207

FOREIGN PATENT DOCUMENTS

| GB | 833639 | 4/1960 |
|---|---|---|
| JP | 33-004692 | 6/1957 |
| JP | 60-156672 | 10/1985 |
| JP | 08-255964 A | 10/1996 |
| JP | 2004-71384 A | 3/2004 |
| JP | 2010-102973 A | 5/2010 |

OTHER PUBLICATIONS

Notification of Reason(s) for Refusal dated Feb. 4, 2014, with English translation.

* cited by examiner

*Primary Examiner* — Renee Luebke
*Assistant Examiner* — Larisa Tsukerman
(74) *Attorney, Agent, or Firm* — McGinn IP Law Group, PLLC

(57) ABSTRACT

A connection structure for connecting a differential signal transmission cable to a circuit board. A differential signal transmission cable includes an outer conductor provided around a pair of signal line conductors via an insulator. Parts of the signal line conductors are exposed from a tip of the differential signal transmission cable. A circuit board is provided with a pair of signal pads and a ground pad. A shield-connecting terminal includes a main body which is crimp-connected to the outer conductor and a solder-connecting pin which is solder-connected to the ground pad. The exposed parts of the signal line conductors are solder-connected to the signal pads, respectively, and the outer conductor is solder-connected to the ground pad via the solder-connecting pin of the shield-connecting terminal.

19 Claims, 12 Drawing Sheets

CONNECTION STRUCTURE AND A CONNECTION METHOD FOR CONNECTING A DIFFERENTIAL SIGNAL TRANSMISSION CABLE TO A CIRCUIT BOARD

The present application is based on Japanese patent application No. 2010-248452 filed on Nov. 5, 2011, the entire contents of which are incorporated herein by reference.

BACKGROUND OF THE INVENTION

1. Field of the Invention

The present invention relates to a connection structure and a connection method for connecting a differential signal transmission cable to a circuit board.

2. Description of the Related Art

In servers, routers, and other storage devices for high speed digital signal transmission at several Gbit/s or more, a differential signal transmission has been used for a signal transmission between equipments or between substrates (circuit boards) in an equipment.

The differential signal transmission (differential signaling) is to transmit two 180° phase-inverted signals through respective ones of a pair of signal line conductors, and to synthesize and output a difference between the two 180° phase-inverted signals received at a receiver side. Since electric currents transmitted through the pair of signal line conductors are flown along directions opposite to each other, it is possible to reduce an electromagnetic wave emitted from transmission paths. Further, in the differential signal transmission, external noises are superimposed on the two signal line conductors equally, so that it is possible to cancel (remove) the effect of the external noises by synthesizing and outputting the difference between the two 180° phase-inverted signals at the receiver side. For the aforementioned reasons, the differential signal transmission has been often used for a high speed digital signal transmission.

Figure 20:
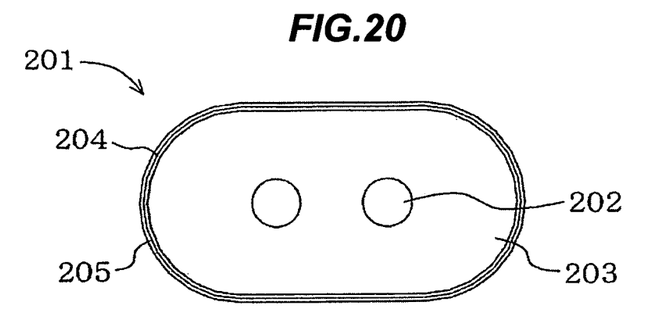
FIG. 20 is a lateral cross sectional view of a differential signal transmission cable.

FIG. 20 shows an example of a conventional differential signal transmission cable 201, which is often used for the differential signal transmission, comprising a pair of signal line conductors 202, an insulator 203 covering the pair of signal line conductors 202, an outer conductor 204 provided around a circumference of the insulator 203, and a sheath 205 provided around a circumference of the outer conductor 204.

The outer conductor 204 may be formed by winding a conductive film-attached tape (shield tape) around the insulator 203, by covering the insulator 203 with braided wires, or the like. The sheath 205 may be formed by winding an insulating tape around the outer conductor 204, by extrusion-coating a resin around the outer conductor 204, or the like.

In the differential signal transmission cable 201, the pair of signal line conductors 202 are juxtaposed (arranged in parallel with each other). According to this structure, a difference in physical length between the pair of signal line conductors is small so that signal attenuation at high frequencies is small compared with those in a differential signal transmission cable comprising a twisted pair of signal line conductors. Further, since the outer conductor 204 is provided to cover the pair of signal line conductors 202, even if a metallic member is placed near the cable, the characteristic impedance will not be unstable. In addition, the noise resistance property (noise immunity) is also high. From these advantages, the differential signal transmission cable 201 has been often used for a relatively high-speed and short-distance signal transmission.

Figure 21:
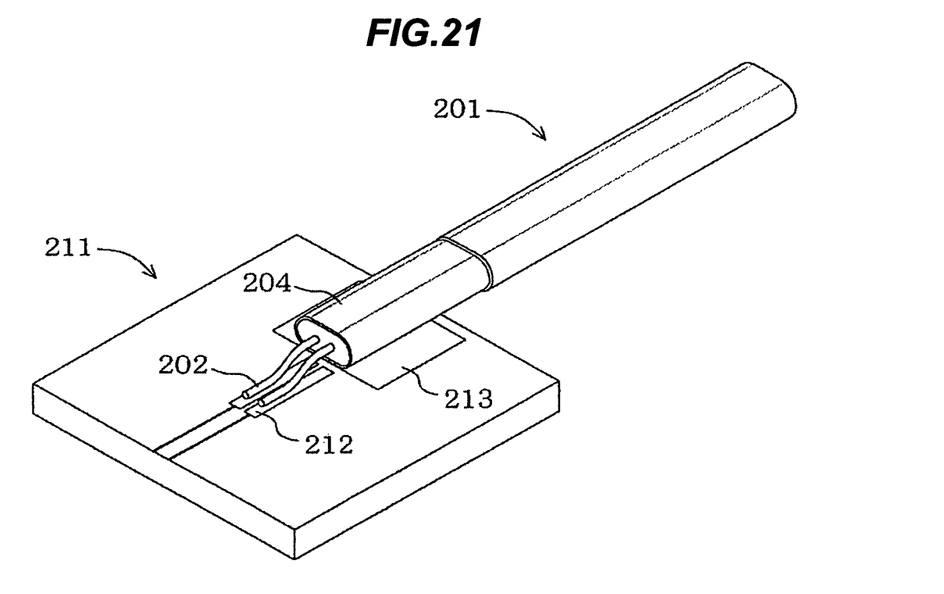
FIG. 21 is a perspective view for showing a conventional connection between a differential signal transmission cable and a circuit board.
Figure 22:
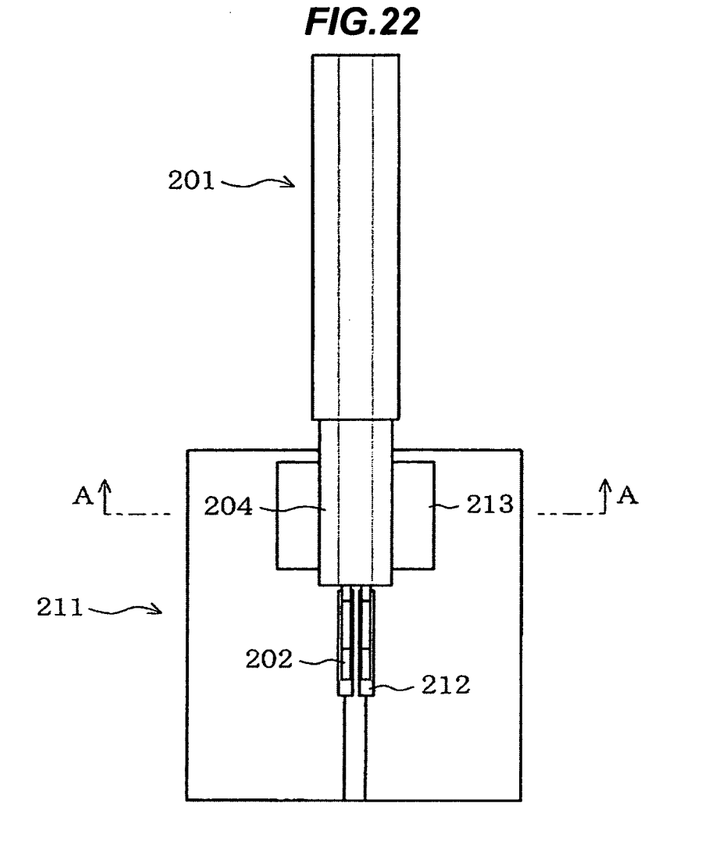
FIG. 22 is a plan view for showing the conventional connection between the differential signal transmission cable and the circuit board.

When the differential signal transmission cable 201 is connected to a circuit board in equipment, as shown in FIGS. 21 and 22, the sheath 205, the outer conductor 204, and the insulator 203 are sequentially peeled off from the differential signal transmission cable 201 by multi-stage stripping. Each of the pair of signal line conductors 202 is solder-connected (i.e. connected by soldering) to each of signal pads 212 formed on a circuit board 211, and the outer conductor 204 is directly solder-connected to a ground pad 213 formed on the circuit board 211.

Japanese Patent Laid-Open No. 2004-71384 (JP-A 2004-71384) discloses a similar connection method and a connection structure for connecting a difference signal transmission cable to a circuit board.

SUMMARY OF THE INVENTION

However, since the outer conductor 204 is directly solder-connected to the ground pad 213 formed on the circuit board 211, the heat of a soldering iron tip is inevitably transmitted to the insulator 203 during a solder-connecting process.

Therefore, the insulator 203 is deformed or fused (melted) due to the heat applied during the solder-connecting process (e.g. about 230 to 280° C.), thereby likely causing the deterioration in characteristics of the differential signal transmission cable 201. Accordingly, solder-worker who carries out the solder-connecting process has been required to have a high skill.

Figure 23:
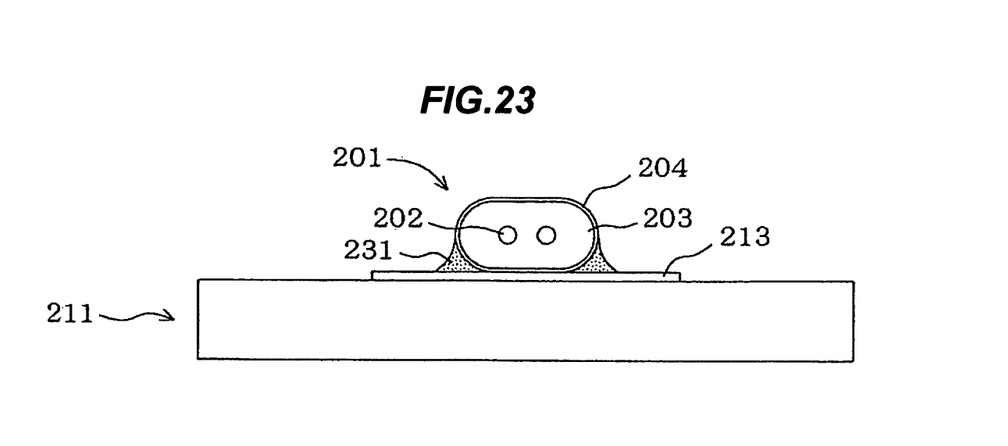
FIG. 23 is a cross sectional view taken along A-A line of FIG. 22 for explaining a solder fillet.

In addition, for surely providing an appropriate solder-connected state (with high reliability) of the outer conductor 204, it is required that a solder fillet is formed by a solder layer 231, as shown in FIG. 23. Further, a width of the ground pad 213 should be widened enough to provide the solder fillet.

Therefore, even if a plurality of differential signal transmission cables 201 are mounted on the circuit board 211, a location pitch (spacing) between the differential signal transmission cables 201 should be adjusted in accordance with the width of the ground pads 213, so that a mounting density of the differential signal transmission cables 201 has been restricted.

Accordingly, an object of the present invention is to provide a connection method and a connection structure for connecting a differential signal transmission cable to a circuit board, by which the fusion or deformation of the insulator during the solder-connecting process can be prevented, and the mounting density of the differential signal transmission cable(s) can be improved.

According to a feature of the invention, a connection structure for connecting a differential signal transmission cable to a circuit board comprises:

a differential signal transmission cable comprising an outer conductor provided around a pair of signal line conductors via an insulator, parts of the signal line conductors being exposed from a tip of the differential signal transmission cable;

a circuit board including a pair of signal pads and a ground pad; and a shield-connecting terminal including a main body which is crimp-connected to the outer conductor and a solder-connecting pin which is solder-connected to the ground pad;

in which the exposed parts of the signal line conductors are solder-connected to the signal pads, respectively, and the outer conductor is solder-connected to the ground pad via the solder-connecting pin of the shield-connecting terminal.

In the connection structure, the main body of the shield-connecting terminal may comprise a plate-like metal, the main body and the solder-connecting pin may be formed in one-piece, and the shield-connecting terminal may surround a circumference of the outer conductor.

In the connection structure, an edge portion of the shield-connecting terminal may be chamfered.

In the connection structure, the solder-connecting pin may comprise plural pins.

In the connection structure, the solder-connecting pin may be provided on a center line which passes through centers of the signal line conductors.

In the connection structure, the signal pads and the ground pad may be formed on an edge portion of the circuit board, in which the signal line conductors may be solder-connected to the signal pads, respectively, the solder-connecting pin may be solder-connected to the ground pad, and the signal line conductors and the solder-connecting pin may be located on the center line.

In the connection structure, the plural pins of the solder-connecting pin may be located to be line-symmetrical with respect to a line that is orthogonal to a center line connecting between the centers of the signal line conductors.

In the connection structure, a lateral cross section of the solder-connecting pin may comprise a polygonal shape.

In the connection structure, the solder-connecting pin may contact with the ground pad in plane-to-plane.

In the connection structure, a lateral cross section of the solder-connecting pin may comprise a circular shape.

In the connection structure, the solder-connecting pin may comprise a base portion having a width greater than a width of a remaining portion of the solder-connecting pin.

In the connection structure, a Sn-plating may be provided on a surface of the solder-connecting pin.

In the connection structure, the insulator collectively may cover a circumference of the signal line conductors, and the outer conductor may be provided around a circumference of the insulator.

In the connection structure, the differential signal transmission cable may comprise a pair of coaxial cables arranged in parallel with each other, in which each of the coaxial cables may comprise each of the signal line conductors, the insulator covering each of the signal line conductors, and the outer conductor provided around a circumference of the insulator.

According to another feature of the invention, a connection method for connecting a differential signal transmission cable to a circuit board comprises:

preparing a differential signal transmission cable comprising an outer conductor provided around a pair of signal line conductors via an insulator;

exposing parts of the signal line conductors from a tip of the differential signal transmission cable;

preparing a circuit board comprising a pair of signal pads and a ground pad;

connecting a shield-connecting terminal comprising a solder-connecting terminal to the outer conductor by crimping;

connecting the exposed parts of the signal line conductors to the signal pads by soldering; and connecting the solder-connecting pin to the ground pad by soldering, thereby connecting the outer conductor to the ground pad via the solder-connecting pin of the shield-connecting terminal.

In the connection method, the connection of the exposed parts of the signal line conductors to the signal pads by soldering and the connection of the solder-connecting pin to the ground pad by soldering may be carried out simultaneously.

Effects of the Invention

According to the invention, it is possible to provide a connection method and a connection structure for connecting a differential signal transmission cable to a circuit board, by which the fusion or deformation of the insulator during the solder-connecting process can be prevented, and the mounting density of the differential signal transmission cable(s) can be improved.

BRIEF DESCRIPTION OF THE DRAWINGS

Next, preferred embodiments according to the present invention will be explained in conjunction with appended drawings, wherein.

DETAILED DESCRIPTION OF THE PREFERRED EMBODIMENTS

Next, preferred embodiments according to the present invention will be explained in more detail in conjunction with the appended drawings.

(First Preferred Embodiment)

Figure 1:
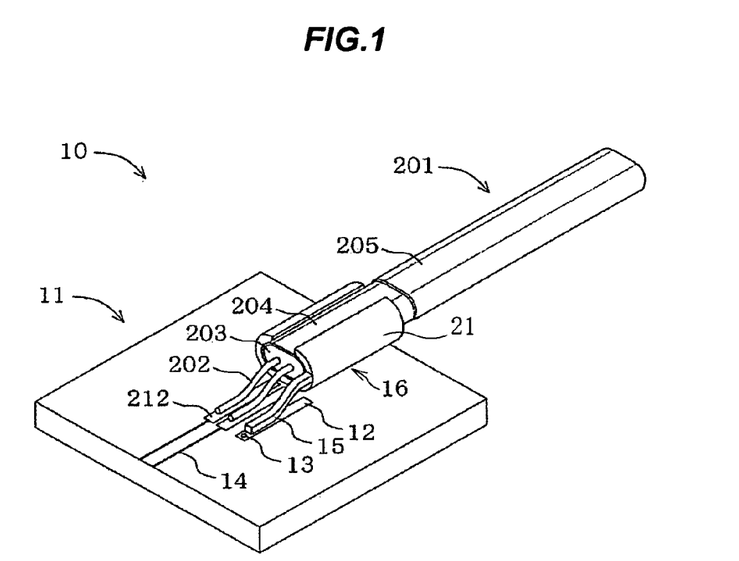
FIG. 1 is a perspective view showing a connection structure between a differential signal transmission cable and a circuit board in the first preferred embodiment.

FIG. 1 is a perspective view showing a connection structure for connecting a differential signal transmission cable to a circuit board in the first preferred embodiment according to the present invention.

(Connection Structure 10)

FIG. 1 shows a connection structure 10 for connecting a differential signal transmission cable 201 to a circuit board 11 in the first preferred embodiment. According to the connection structure 10, the differential signal transmission cable 201, in which an outer conductor 204 is provided around a circumference of a pair of signal line conductors 202 via an insulator 203 and the pair of signal line conductors 202 are exposed to the outside from a tip of the differential signal transmission cable 201, is solder-connected to the circuit board 11.

In addition, the differential signal transmission cable 201 has the same configuration as the differential signal transmission cable described referring to FIG. 20, also, the circuit board 11 has substantially the same configuration as the circuit board 211 described referring to FIG. 21. Therefore, the same reference numerals are assigned to parts having similar function, and detailed explanation thereof is omitted.

On the circuit board 11, a pair of signal pads 212 to be connected to the pair of signal line conductors 202 respectively and a ground pad 12 to be connected to the outer conductor 204 are formed.

The ground pad 12 is formed in parallel with the pair of signal pads 212 at one side of the pair of signal pads 212, and connected to a ground (not shown) formed on an entire back surface of the circuit board 11 through a through-hole 13.

On the other hand, the signal pads 212 are connected to a signal line 14 formed on the circuit board 11, and signals are transmitted through this signal line 14.

The signal pads 212, the signal line 14, and the ground pad 12 as well as a circuit pattern (not shown) may be formed simultaneously on the circuit board 11.

In this connection structure 10, the outer conductor 204 of the differential signal transmission cable 201 is connected to the ground pad 12 of the circuit board 11 by the means of a shield-connecting terminal 16.

(Shield-Connecting Terminal 16)

Figure 2A:
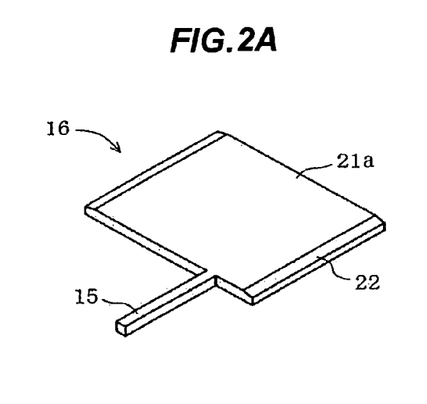
FIGS. 2A and 2B are perspective views showing structures of shield-connecting terminals.
Figure 2B:
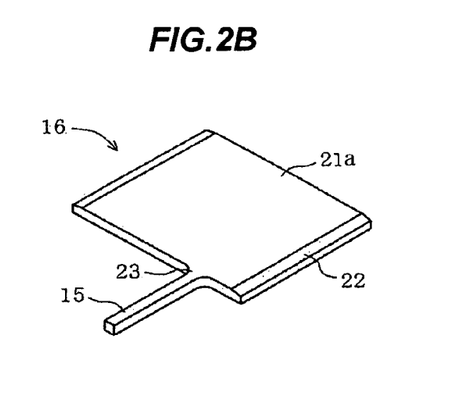

FIGS. 2A, and 2B are perspective views of structures of shield-connecting terminals. The shield-connecting terminal 16 comprises a main body 21 and a solder-connecting pin 15. The shield-connecting terminal 16 is crimp-connected (connected by crimping, caulking) to the outer conductor 204. More concretely, the main body 21 of the shield-connecting terminal 16 is connected to the outer conductor 204 by crimping, and the solder-connecting pin 15 of the shield-connecting terminal 16 is solder-connected to the ground pad 12.

In other words, the connection structure 10 has a configuration in that the exposed signal line conductors 202 are solder-connected to the signal pads 212, and the outer conductor 204 is solder-connected to the ground pad 12 via the solder-connecting pin 15 of the shield-connecting terminal 16.

Referring to FIG. 1 and FIG. 2A, the shield-connecting terminal 16 comprises the main body 21 formed of a plate-like metal (metallic plate) 21a and the solder-connecting pin 15. The main body 21 and the solder-connecting pin 15 are formed integrally (i.e. in one-piece). The shield-connecting terminal 16 is crimp-connected to the outer conductor 204 by bending the main body 21 to surround a circumference of the outer conductor 204.

Edge portions 22 of the shield-connecting terminal 16 are chamfered, such that the shield-connecting terminal 16 would not damage the outer conductor 204 when the shield-connecting terminal 16 is crimp-connected to the outer conductor 204 of the differential signal transmission cable 201. Therefore, the chamfering is preferably carried out on at least the edge portion 22 which may contact with the outer conductor 204 when the shield-connecting terminal 16 is connected to the outer conductor 204 by crimping.

Further, Sn-plating is preferably provided on a surface of the shield-connecting terminal 16. According to this structure, the solder wettability in the solder-connection can be improved, thereby realizing the solder-connection with high reliability.

Referring to FIG. 2B, it is preferable that a width of a base portion 23 of the solder-connecting pin 15 is preferably greater than a width of a remaining portion (including a tip) of the solder-connecting pin 15, such that the strength of the solder-connecting pin 15 is enhanced at the base portion 23. According to this structure, it is possible to suppress a phenomenon such as damage by breaking of the solder-connecting pin 15 due to the stress applied to the solder-connecting pin 15 by forming process.

Figure 3A:
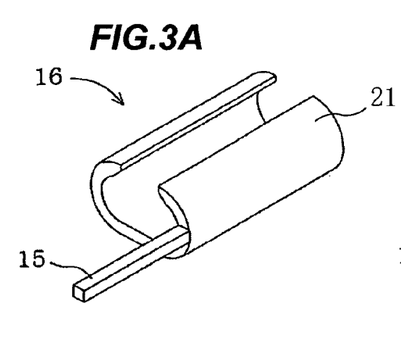
FIGS. 3A to 3C are perspective views showing various embodiments of solder-connecting pin.

Referring to FIG. 3A, a lateral cross section of the solder-connecting pin 15 has a rectangular shape. The shield-connecting terminal 16 is formed by e.g. press-cutting (punching) a metal plate. If the lateral cross section of the solder-connecting pin 15 is rectangular, the shield-connecting terminal 16 can be formed by only one step of press-cutting, which can reduce the manufacturing cost.

Figure 3B:
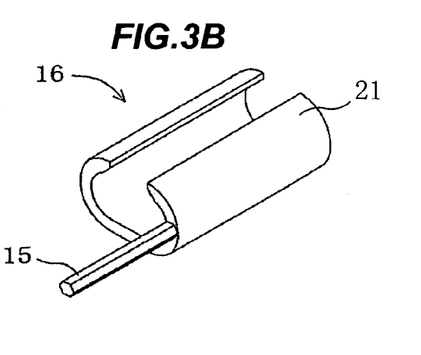

Referring to FIG. 3B, a lateral cross section of the solder-connecting pin 15 may have a polygonal shape other than the rectangular shape. In this case, it is preferable that the lateral cross section of the solder-connecting pin 15 has the polygonal shape such that one side of the polygonal shape faces to the ground pad 12. According to this structure, the solder-connecting pin 15 is solder-connected to the ground pad 12 such that the solder-connecting pin 15 contacts with the ground pad 12 in plane-to-plane at the time of solder-connection. Therefore, it is possible to carry out a preferable solder-connection, thereby improving the connection reliability.

Figure 3C:
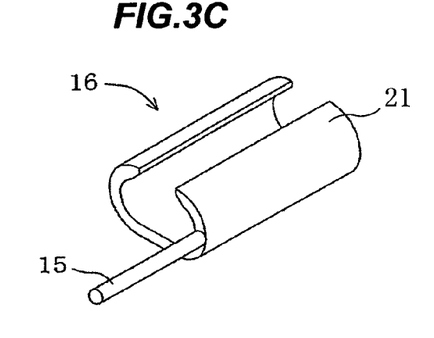

Referring to FIG. 3C, a lateral cross section of the solder-connecting pin 15 may have a circular shape. In the case that the stress is applied to the solder-connecting pin 15 by the forming process, if a corner portion exists in the lateral cross section of the solder-connecting pin 15, the stress concentration may occur at such a corner portion. As a result, the corner portion may become an origin of the crack. By providing the solder-connecting pin 15 with the circular lateral cross section, it is possible to release the stress concentration, thereby preventing the solder-connecting pin 15 from being broken.

Figure 4:
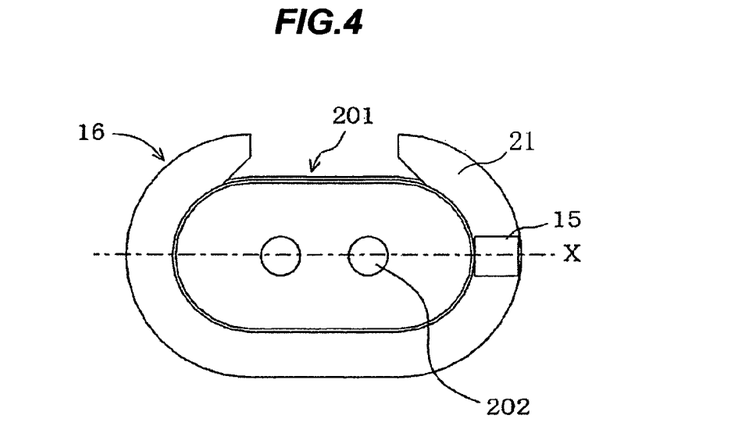
FIG. 4 is a front view for explaining a preferable position of the solder-connecting pin.

Referring to FIG. 4, the solder-connecting pin 15 may be preferably provided on a center line X which passes through the centers of the pair of signal line conductors 202. When the differential signal transmission cable 201 is connected to the circuit board 11, the forming process is carried out on the signal line conductors 202 and the solder-connecting pin 15, so that the signal line conductors 202 and the solder-connecting pin 15 are connected by solder to the signal pads 212 and the ground pad 12. At this stage, if the solder-connecting pin 15 is provided on the center line X which passes through the centers of the pair of signal line conductors 202, the forming process for the solder-connection can be carried out on the signal line conductors 202 and the solder-connecting pin 15 collectively and simultaneously in the same manner. Accordingly, it is possible to reduce the manufacturing cost.

From the viewpoint of the characteristics, the shield-connecting terminal 16 is ideally located to surround an entire circumference of the outer conductor 204 of the differential signal transmission cable 201 when the shield-connecting terminal 16 is connected by crimping. However, it is not absolutely necessary to provide the shield-connecting terminal 16 around the entire circumference of the outer conductor 204, with considering the easiness in manufacturing.

In addition, the crimping connection of the shield-connecting terminal 16 is preferably carried out with a crimping force which does not deform the differential signal transmission cable 201. Accordingly, it is possible to maintain the symmetry of the differential signal transmission cable 201, thereby preventing the deterioration of the transmission characteristics of the differential signal transmission cable 201.

(Connection Method)

Next, a connection method for connecting the differential signal transmission cable to the circuit board will be explained below in accordance with respective steps.

First of all, a differential signal transmission cable and a circuit board are prepared. The differential signal transmission cable is not limited to the differential signal transmission cable 201 explained referring to FIG. 20. Any differential signal transmission cable having a configuration in which an outer conductor is provided around a pair of signal line conductors via an insulator can be used other than the differential signal transmission cable 201. For example, the differential signal transmission cable has a configuration, in which a pair of coaxial cables are juxtaposed, and each coaxial cable comprises a signal line conductor, an insulator provided around a circumference of the signal line conductor, and an outer conductor provided around a circumference of the insulator.

Figure 5:
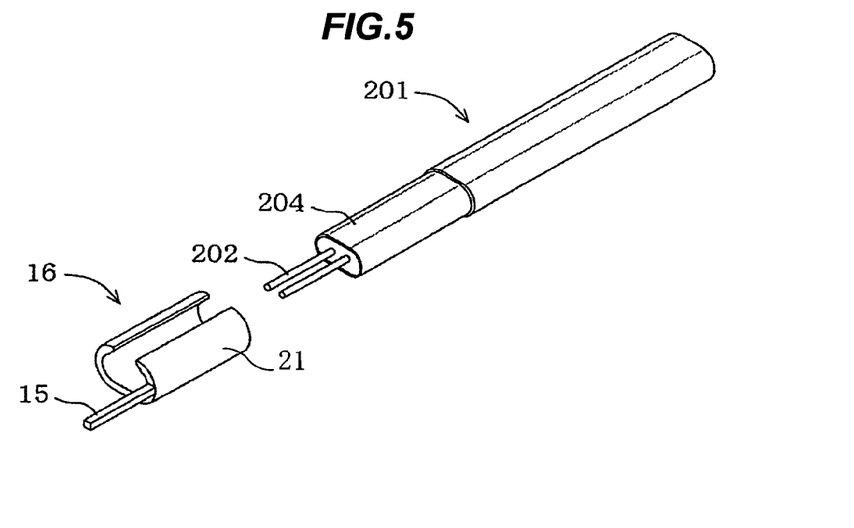
FIG. 5 is a perspective view for explaining a connection method for connecting a differential signal transmission cable to a circuit board.

Next, referring to FIG. 5, the multi-stage peeling are carried out sequentially on the differential signal transmission cable 201 to expose the outer conductor 204 and the signal line conductors 202 from the tip of the differential signal transmission cable 201. Thereafter, the shield-connecting terminal 16 including the solder-connecting pin 15 to be solder-connected to the ground pad 12 is connected to the outer conductor 204 by crimping.

Figure 6:
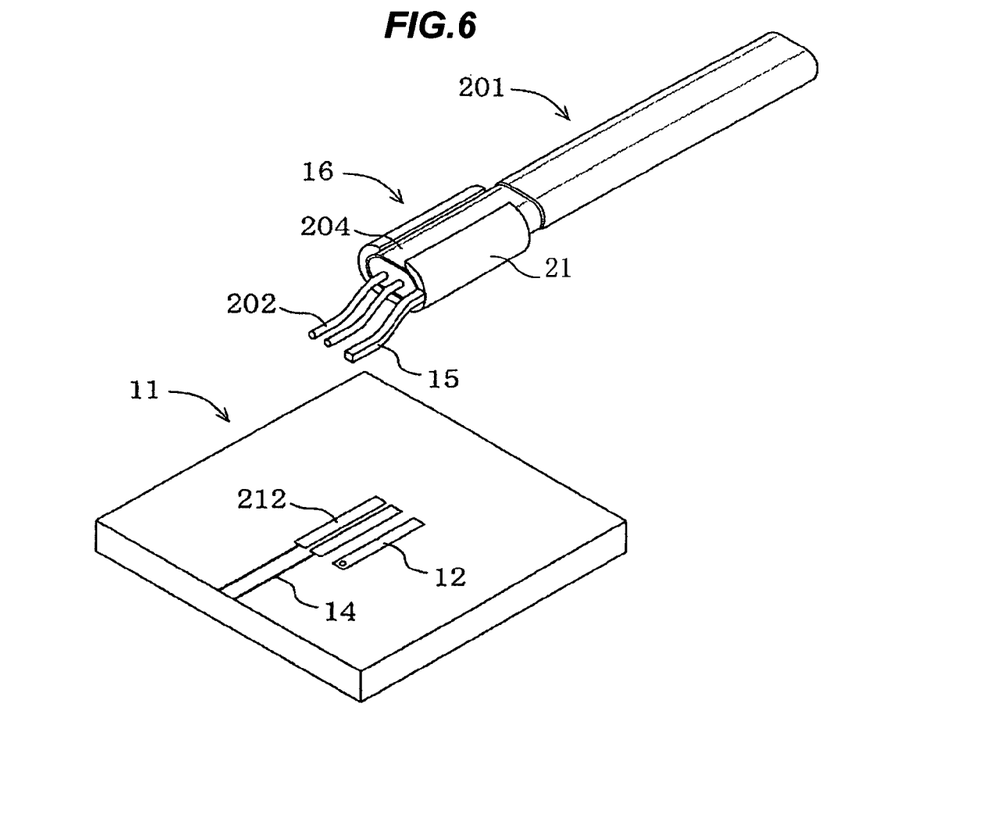
FIG. 6 is a perspective view for explaining a connection method for connecting a differential signal transmission cable to a circuit board.

Next, referring to FIG. 6, the forming process is carried out on the signal line conductors 202 of the differential signal transmission cable 201 and the solder-connecting pin 15 collectively (i.e. as a whole). Then, the differential signal transmission cable 201 is located on the circuit board 11 while positioning (aligning) the solder-connecting pin 15 to the ground pad 12 as well as the signal line conductors 202 to the signal pads 212.

Next, the exposed parts of the signal line conductors 202 are solder-connected to the signal pads 212, and the solder-connecting pin 15 is solder-connected to the ground pad 12 such that the outer conductor 204 is solder-connected to the ground pad 12 via the solder-connecting pin 15 of the shield-connecting terminal 16. The connection of the signal line conductors 202 to the signal pads 212, and the connection of the solder-connecting pin 15 to the ground pad 12 may be carried out simultaneously.

(Connection of Plural Differential Signal Transmission Cables)

Figure 7:
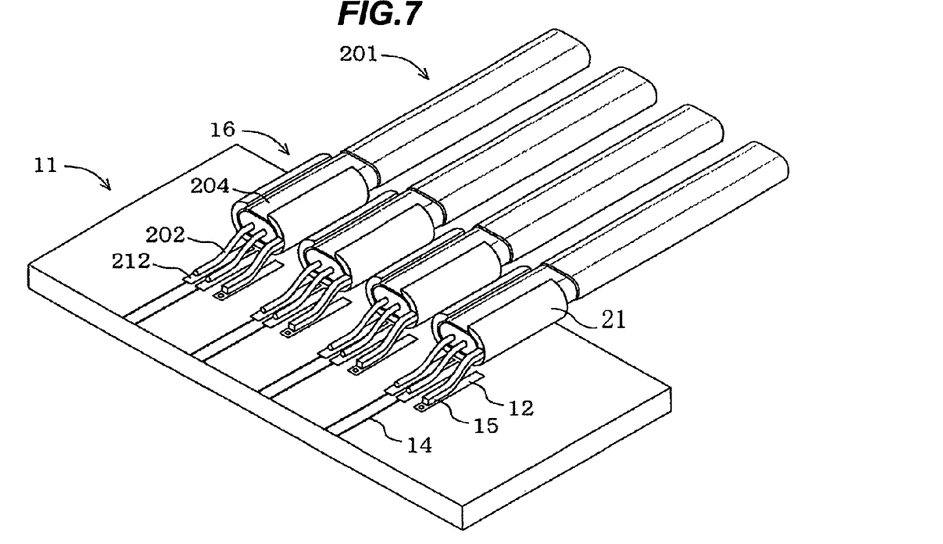
FIG. 7 is a perspective view for explaining a connection method for connecting differential signal transmission cables to a circuit board.

FIG. 7 shows the case that a plurality of differential signal transmission cables 201 are mounted on the circuit board 11. Each of the differential signal transmission cables 201 is connected to the circuit board 11 in accordance with the aforementioned steps.

Figure 8:
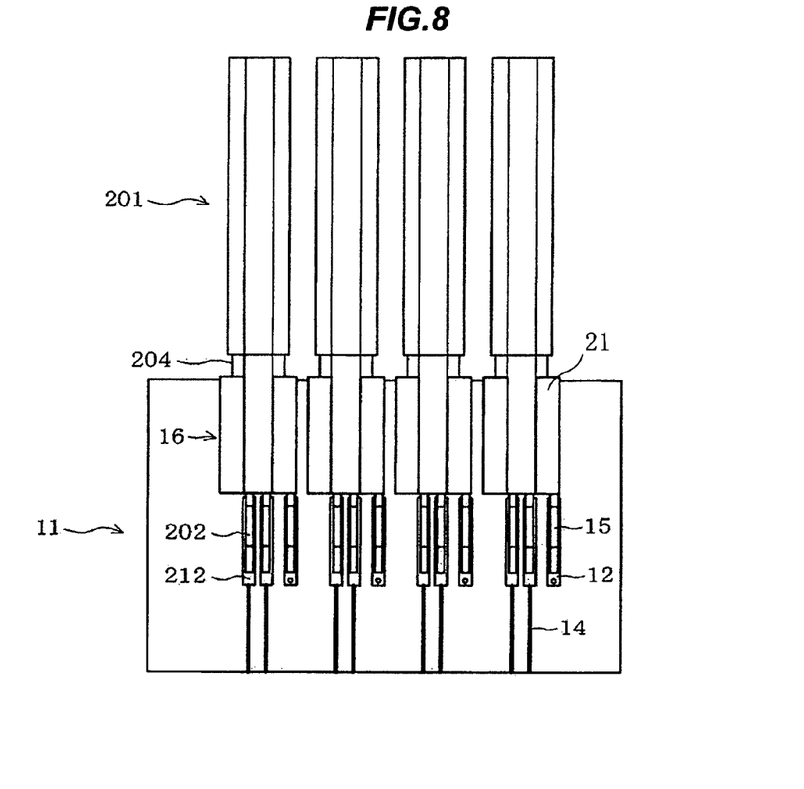
FIG. 8 is a plan view for explaining a connection method for connecting differential signal transmission cables to a circuit board.

In this case, referring to FIG. 8, the plurality of differential signal transmission cables 201 are located such that the shield-connecting terminals 16, each of which is crimp-connected, of adjacent differential signal transmission cables 201 do not contact with each other lithe adjacent shield-connecting terminals 16 contact with each other, a crosstalk may occur between the adjacent differential signal transmission cables 201.

Figure 9:
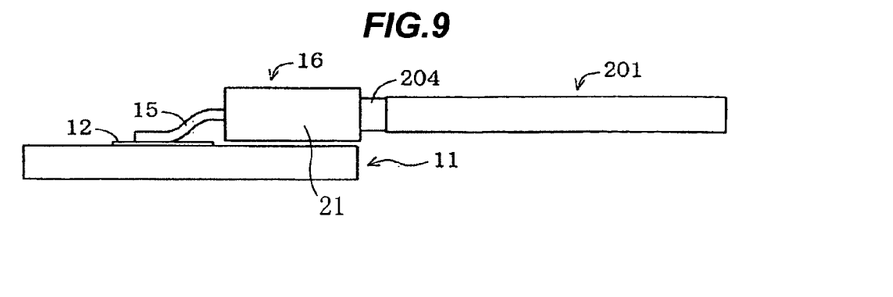
FIG. 9 is a side view for explaining a connection method for connecting a differential signal transmission cable to a circuit board.

According to the connection structure 10 obtained by the aforementioned process, referring to FIG. 9, the outer conductor 204 of the differential signal transmission cable 201 is solder-connected to the ground pad 12 via the solder-connecting pin 15 of the shield-connecting terminal 16, without being directly solder-connected to the ground pad 12. Therefore, it is possible to suppress the transfer of the heat applied during the solder-connection process to the insulator 203, thereby preventing the insulator 203 from deformation or fusion. According to this method, it is possible to connect the differential signal transmission cable 201 to the circuit board 11, while preventing the deterioration of the characteristics of the differential signal transmission cable 201, even if the solder-worker doing the solder-connection does not have the high skill that has been required for the solder-worker.

In the connection structure 10, the differential signal transmission cable 201 is grounded by connecting the solder-connecting pin 15 having a narrower width than a width of the differential signal transmission cable 201 to the ground pad 12 by soldering. Therefore, even though the plurality of differential signal transmission cables 201 are mounted on the circuit board 11, it is possible to mount each differential signal transmission cable 201 with a width dimension substantially same as that of the shield-connecting terminal 16. Accordingly, it is possible to improve the mounting density of the differential signal transmission cables 201 compared with the conventional connection structure and connection method.

(Second Preferred Embodiment)

Next, a connection structure for connecting a differential signal transmission cable to a circuit board in the second preferred embodiment according to the present invention will be explained below.

(Connection Structure 100)

Figure 10:
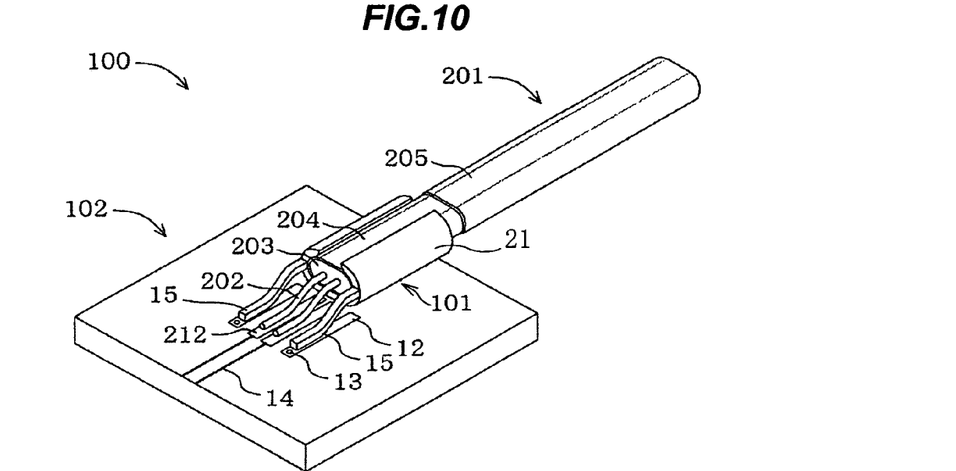
FIG. 10 is a perspective view showing a connection structure between a differential signal transmission cable and a circuit board in the second preferred embodiment.

FIG. 10 shows a connection structure 100 in the second preferred embodiment, which is similar to the connection structure 10 in the first preferred embodiment, except a shield-connecting terminal 101 comprising two solder-connecting pins 15 which sandwich the pair of signal line conductors 202, and a circuit board 102 including two grand pads 12 which are formed in correspondence with the two solder-connecting pins 15.

Figure 11A:
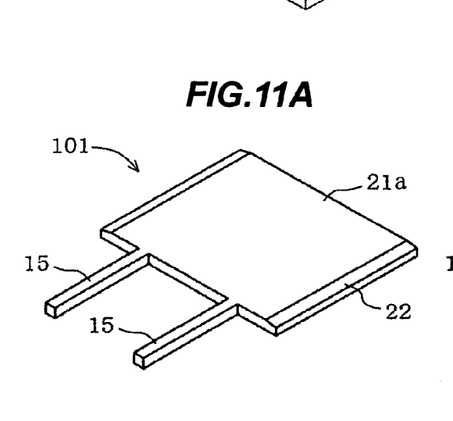
FIGS. 11A and 11B are perspective views showing structures of shield-connecting terminals.

Referring to FIG. 10 and FIG. 11A, the shield-connecting terminal 101 comprises a main body 21 formed of a metallic plate 21a and a pair of solder-connecting pins 15. The main body 21 and the solder-connecting pins 15 are formed integrally (i.e. in one-piece). The main body 21 is bent to surround the circumference of the outer conductor 204, and the shield-connecting terminal 101 is connected to the outer conductor 204 by crimping.

Similarly to the first preferred embodiment, the edge portions 22 of the shield-connecting terminal 101 are chamfered. The Sn-plating is provided on a surface of the shield-connecting terminal 101.

Figure 11B:
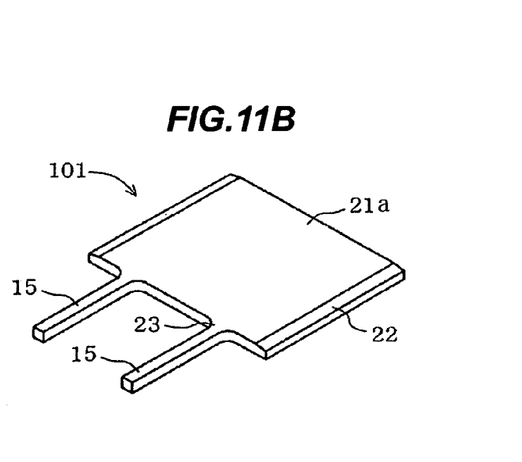

Referring to FIG. 11B, a base portion 23 of each of the solder-connecting pin 15 is preferably formed to have a greater width than a remaining portion of the solder-connecting pin 15, so that the strength of the solder-connecting pin 15 can be enhanced.

Figures 12A, 12B:
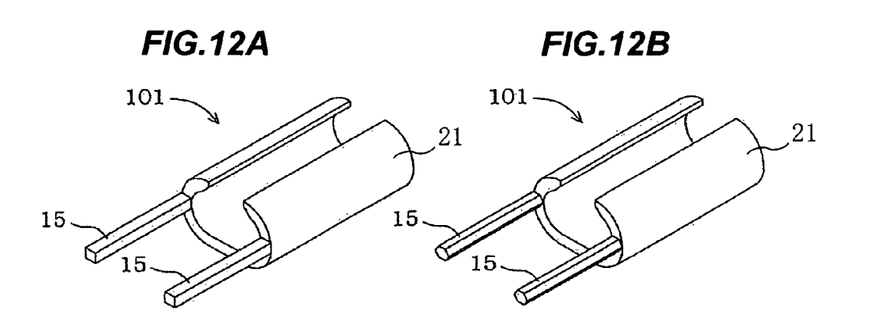
FIGS. 12A to 12C are perspective views showing various embodiments of solder-connecting pins.
Figure 12C:
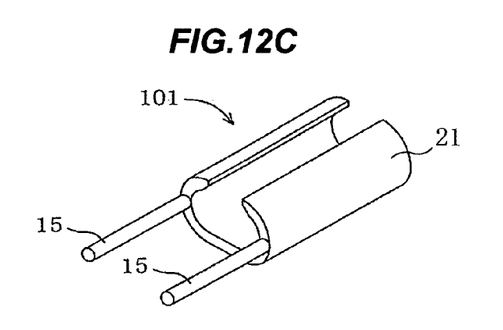

Referring to FIGS. 12A to 12C, a lateral cross section of the solder-connecting pin 15 may have a rectangular shape, a polygonal shape other than the rectangular shape, or a circular shape.

The present invention is based on the differential signal transmission. In the differential signal transmission, the characteristic symmetry in the paired signal line conductors 202 greatly affects on the signal transmission characteristics. Therefore, as shown in FIG. 13, it is preferable that the pair of solder-connecting pins 15 are located to be line-symmetrical with respect to a line Y that is orthogonal to a center line connecting between the centers of the pair of signal line conductors 202, so as to maintain the symmetry in the characteristics of the paired signal line conductors 202 (especially, the ground characteristics here).

Figure 13:
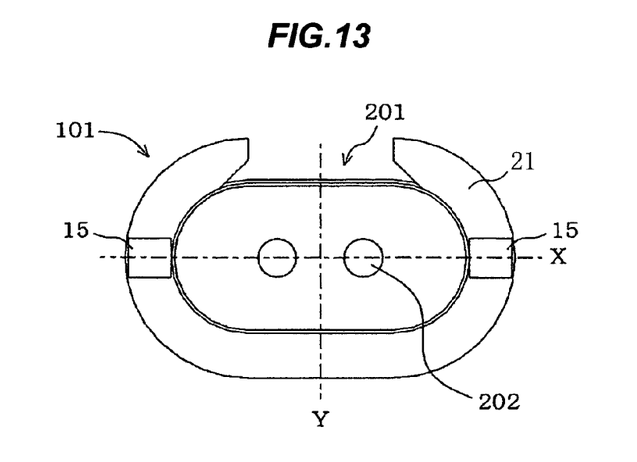
FIG. 13 is a front view for explaining a preferable position of the solder-connecting pins.

Further, referring to FIG. 13, the pair of solder-connecting pins 15 are preferably located on the center line X passing through the centers of the pair of signal line conductors 202, so as to facilitate the forming process.

The shield-connecting terminal 101 is ideally located to surround an entire circumference of the outer conductor 204 of the differential signal transmission cable 201 when the shield-connecting terminal 101 is connected by crimping. However, it is not absolutely necessary to provide the shield-connecting terminal 101 around the entire circumference of the outer conductor 204, with considering the easiness in manufacturing.

In addition, the crimping connection of the shield-connecting terminal 101 is preferably carried out with a crimping force which does not deform the differential signal transmission cable 201. Accordingly, it is possible to maintain the symmetry of the differential signal transmission cable 201, thereby preventing the deterioration of the transmission characteristics of the differential signal transmission cable 201.

(Connection Method)

Next, a connection method for connecting the differential signal transmission cable to the circuit board will be explained below in accordance with respective steps.

First of all, a differential signal transmission cable and a circuit board are prepared. The differential signal transmission cable is not limited to the differential signal transmission cable 201 explained referring to FIG. 20. Any differential signal transmission cable having a configuration in which an outer conductor is provided around a pair of signal line conductors via an insulator can be used other than the differential signal transmission cable 201. For example, the differential signal transmission cable has a configuration, in which a pair of coaxial cables are juxtaposed. Each coaxial cable comprises a signal line conductor, an insulator provided around a circumference of the signal line conductor, and an outer conductor provided around a circumference of the insulator.

Figure 14:
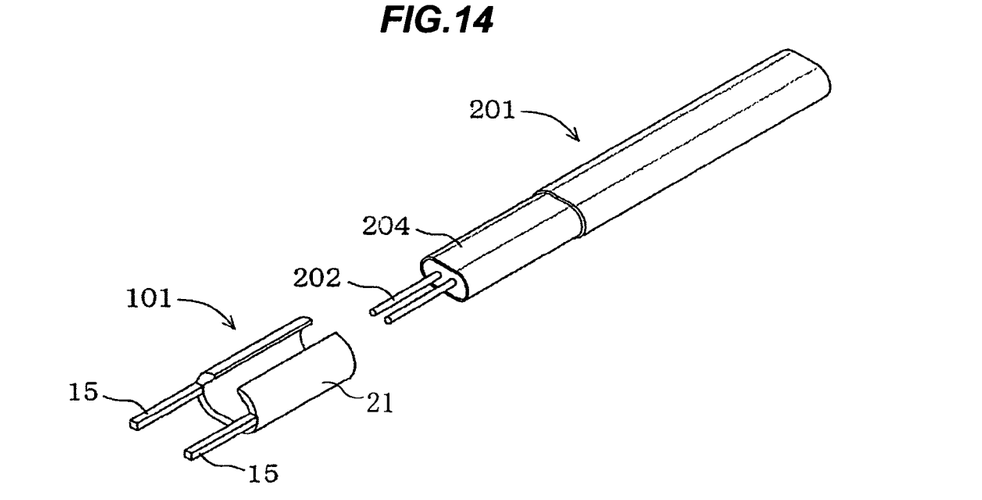
FIG. 14 is a perspective view for explaining a connection method for connecting a differential signal transmission cable to a circuit board.

Next, referring to FIG. 14, the multi-stage peeling is carried out sequentially on the differential signal transmission cable 201 to expose the outer conductor 204 and the signal line conductors 202 from the tip of the differential signal transmission cable 201. Thereafter, the shield-connecting terminal 101 including the solder-connecting pins 15 to be solder-connected to the ground pads 12 is connected to the outer conductor 204 by crimping.

Figure 15:
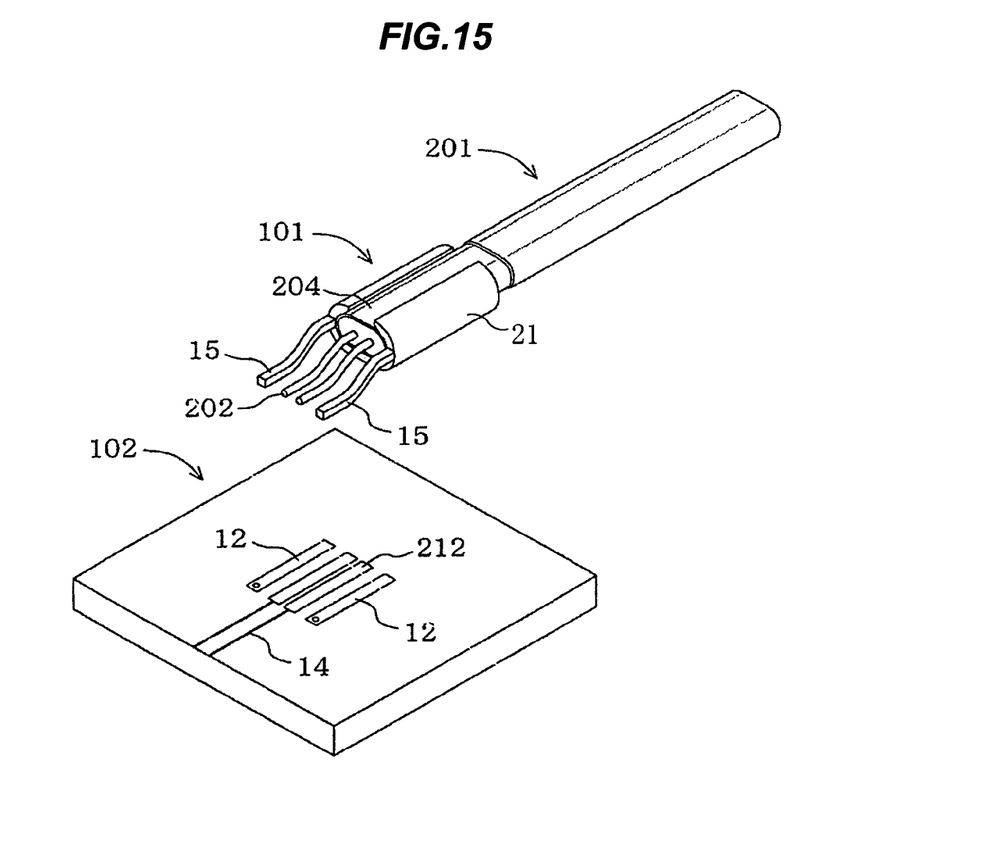
FIG. 15 is a perspective view for explaining a connection method for connecting a differential signal transmission cable to a circuit board.

Next, referring to FIG. 15, the forming process is carried out on the signal line conductors 202 of the differential signal transmission cable 201 and the solder-connecting pins 15 collectively. Then, the differential signal transmission cable 201 is located on the circuit board 11 while positioning (aligning) the solder-connecting pins 15 to the ground pads 12 as well as the signal line conductors 202 to the signal pads 212.

Next, the exposed signal line conductors 202 are solder-connected to the signal pads 212, and the solder-connecting pins 15 are solder-connected to the ground pads 12 such that the outer conductor 204 is solder-connected to the ground pads 12 via the solder-connecting pins 15 of the shield-connecting pin 101. The connection of the signal line conductors 202 to the signal pads 212, and the connection of the solder-connecting pins 15 to the ground pads 12 may be carried out simultaneously.

Figure 16:
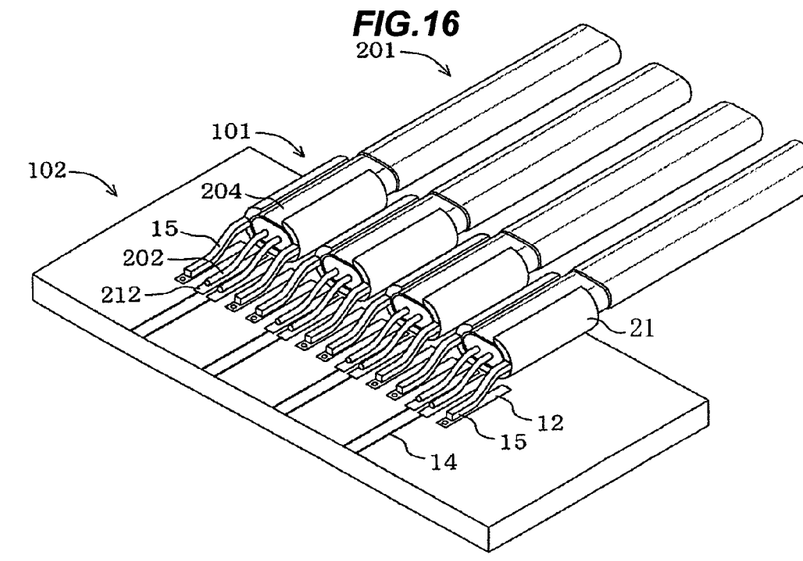
FIG. 16 is a perspective view for explaining a connection method for connecting differential signal transmission cables to a circuit board.

Referring to FIG. 16, in the case that a plurality of differential signal transmission cables 201 are mounted on the circuit board 102, each of the differential signal transmission cables 201 is connected to the circuit board 102 in accordance with the aforementioned steps.

Figure 17:
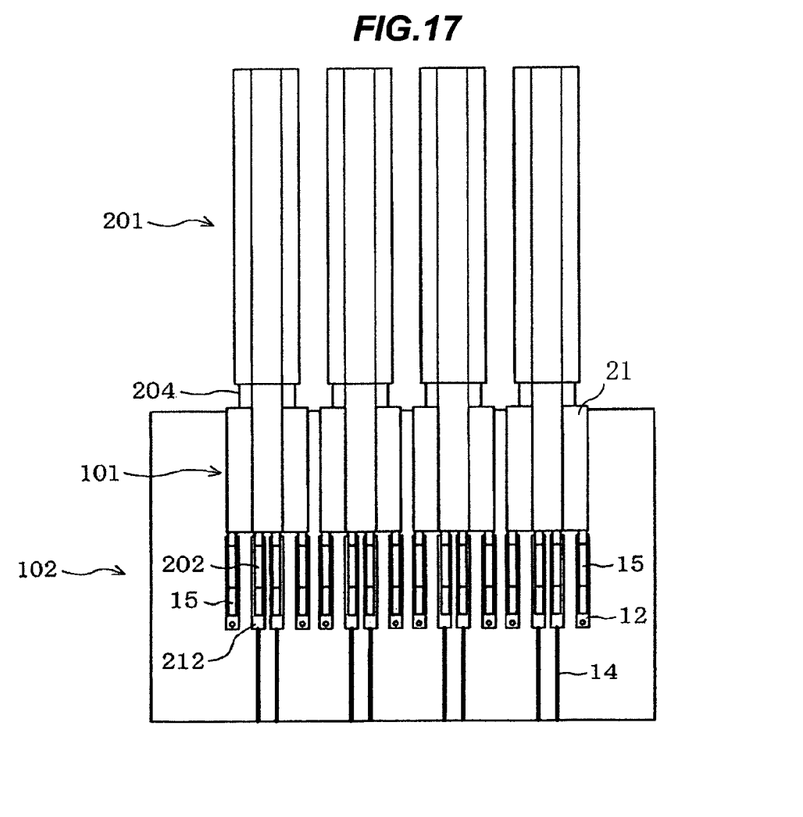
FIG. 17 is a plan view for explaining a connection method for connecting differential signal transmission cables to a circuit board.

In this case, referring to FIG. 17, the plurality of differential signal transmission cables 201 are located such that the shield-connecting terminals 101, each of which is crimp-connected, of adjacent differential signal transmission cables 201 do not contact with each other. If the adjacent shield-connecting terminals 101 contact with each other, a crosstalk may occur between the adjacent differential signal transmission cables 201.

Figure 18:
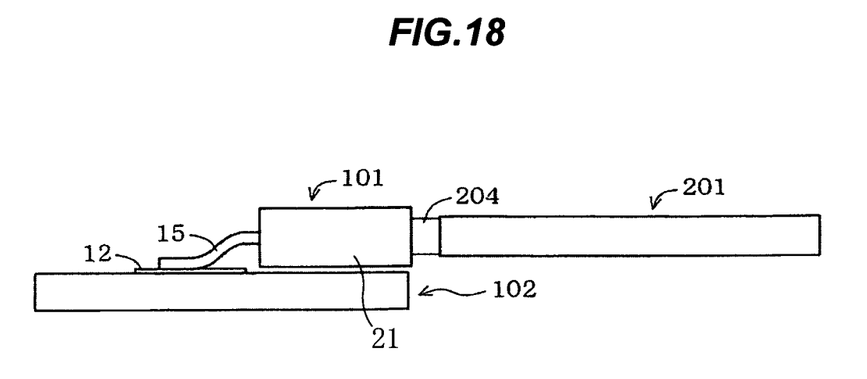
FIG. 18 is a side view for explaining a connection method for connecting a differential signal transmission cable to a circuit board.

According to the connection structure 100 obtained by the aforementioned process, referring to FIG. 18, the outer conductor 204 of the differential signal transmission cable 201 is solder-connected to the ground pads 12 via the solder-connecting pins 15 of the shield-connecting terminal 101, without being directly solder-connected to the ground pads 12, Therefore, it is possible to suppress the transfer of the heat applied during the solder-connection process to the insulator 203, thereby preventing the insulator 203 from deformation or fusion. According to this method, it is possible to connect the differential signal transmission cable 201 to the circuit board 102, while preventing the deterioration of the characteristics of the differential signal transmission cable 201, even if the solder-worker doing the solder-connection does not have the high skill that has been required for the solder-worker In the connection structure 100, the differential signal transmission cable 201 is grounded by connecting the solder-connecting pins 15, each of which has a narrower width than a width of the differential signal transmission cable 201, to the ground pads 12 by soldering. Therefore, even though a plurality of differential signal transmission cables 201 are mounted on the circuit board 102, it is possible to mount each of the differential signal transmission cables 201 with a width dimension substantially same as that of the shield-connecting terminal 101. Accordingly, it is possible to improve the mounting density of the differential signal transmission cables 201 compared with the conventional connection structure and connection method.

Further, in the connection structure 100, the pair of solder-connecting pins 15 of the shield-connecting terminal 101 are located to be line-symmetrical with respect to the line Y that is orthogonal to the center line connecting between the centers of the pair of signal line conductors 202. Therefore, it is possible to maintain the symmetry in the characteristics of the paired signal line conductors 202. Accordingly, it is possible to further prevent the deterioration in the transmission characteristics compared with the connection structure 10 using the shield-connecting terminal 16 including only one solder-connecting pin 15.

(Variation of the Connection Structure)

Next, a connection structure in a variation of the present application will be explained below.

In the first and second preferred embodiments, the invention is explained assuming that the forming process is carried out on the signal line conductors 202 and the solder-connecting pin 15. However, referring to FIGS.19A and 19B, signal pads 212 and a ground pad 12 are formed on an edge portion of a circuit board 191. The signal line conductors 202 and the solder-connecting pin 15 are located on the center line X, and solder-connected to the signal pads 212 and the ground pad 12, respectively, without the forming process of the signal line conductors 202 and the solder-connecting pin 15.

Figure 19A:
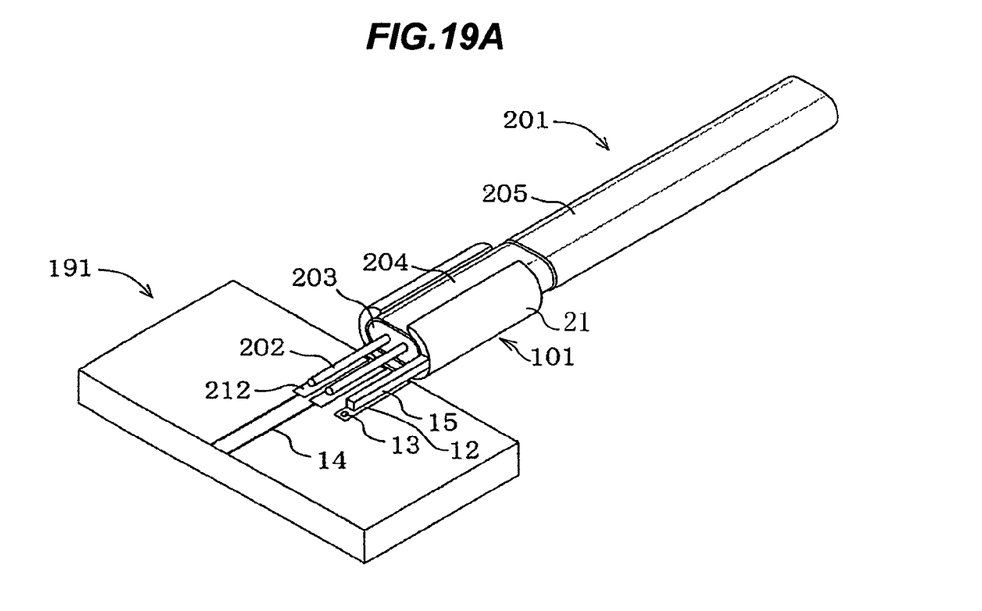
FIGS. 19A and 19B are perspective views for showing a connection structure between a differential signal transmission cable and a circuit board in a variation of the present invention.
Figure 19B:
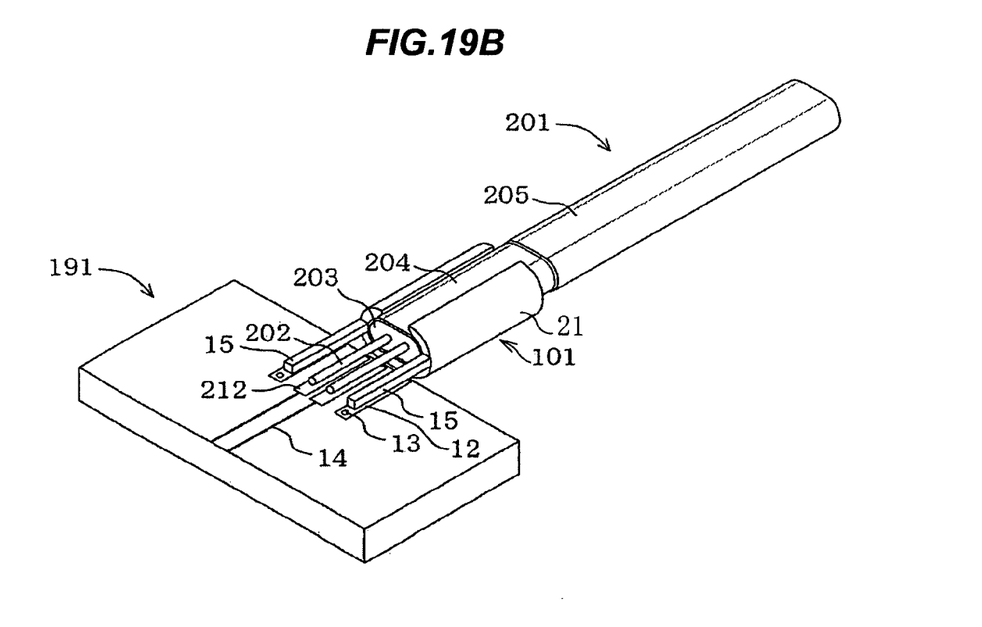

According to this variation, it is possible to reduce the forming step, thereby reducing the manufacturing cost. In addition, it is possible to easily maintain the symmetry of the signal line conductors 202 and the solder-connecting pin 15, and to easily prevent the deterioration of the transmission characteristics, compared with the embodiments in which the forming step is carried out.

Further, in the first and second preferred embodiments and the aforementioned variation, resin-molding may be carried out for covering the connection structure after connecting the differential signal transmission cable to the circuit board, so as to ensure the water tightness and strength of the connection structure.

Although the invention has been described, the invention according to claims is not to be limited by the above-mentioned embodiments and examples. Further, please note that not all combinations of the features described in the embodiments and the examples are not necessary to solve the problem of the invention.

What is claimed is:

1. A connection structure for connecting a differential signal transmission cable to a circuit board, the connection structure comprising:
the differential signal transmission cable comprising an outer conductor provided around a pair of signal line conductors via an insulator, parts of the signal line conductors being exposed from a tip of the differential signal transmission cable;
the circuit board including a pair of signal pads and a ground pad; and
a shield-connecting terminal including a main body which is crimp-connected to the outer conductor and a solder-connecting pin which is solder-connected to the ground pad;
wherein the exposed parts of the signal line conductors are solder-connected to the signal pads, respectively, and the outer conductor is solder-connected to the ground pad via the solder-connecting pin of the shield-connecting terminal, and
wherein the solder-connecting pin comprises two separate pins located to sandwich the signal line conductors, the two separate pins extending from an end of the outer conductor.

2. The connection structure according to claim 1, wherein the main body of the shield-connecting terminal comprises a plate-like metal, the main body and the solder-connecting pin are formed in one-piece, and the shield-connecting terminal surrounds a circumference of the outer conductor.

3. The connection structure according to claim 1, wherein an edge portion of the shield-connecting terminal is chamfered, and the edge portion is configured to contact the outer conductor when the shield-connecting terminal is connected to the outer conductor by crimping.

4. The connection structure according to claim 1, wherein the signal line conductors and the pins are connected to a common surface of the circuit board.

5. The connection structure according to claim 4, wherein the plural pins of the solder-connecting pin are located to be line-symmetrical with respect to a line that is orthogonal to a center line connecting between centers of the signal line conductors.

6. The connection structure according to claim 1, wherein the pins are provided on a center line which passes through centers of the signal line conductors, and the signal line conductors and the pins are connected to a common surface of the circuit board.

7. The connection structure according to claim 6, wherein the signal pads and the ground pad are formed on an edge portion of the circuit board, the signal line conductors are solder-connected to the signal pads, respectively, the solder-connecting pin is solder-connected to the ground pad, and the signal line conductors and the solder-connecting pin are located on the center line.

8. The connection structure according to claim 1, wherein a lateral cross section of the solder-connecting pin comprises a polygonal shape.

9. The connection structure according to claim 8, wherein the solder-connecting pin contacts with the ground pad in plane-to-plane.

10. The connection structure according to claim 1, wherein a lateral cross section of the solder-connecting pin comprises a circular shape.

11. The connection structure according to claim 1, wherein the solder-connecting pin comprises a base portion having a width greater than a width of a remaining portion of the solder-connecting pin.

12. The connection structure according to claim 1, wherein a Sn-plating is provided on a surface of the solder-connecting pin.

13. The connection structure according to claim 1, wherein the insulator collectively covers a circumference of the signal line conductors, and the outer conductor is provided around a circumference of the insulator.

14. The connection structure according to claim 1, wherein the differential signal transmission cable comprises a pair of coaxial cables arranged in parallel, and
wherein each of the coaxial cables comprises each of the signal line conductors, the insulator covering each of the signal line conductors, and the outer conductor being provided around a circumference of the insulator.

15. The connection structure according to claim 1, wherein the shield-connecting terminal is crimped while avoiding deformation of the differential signal transmission cable.

16. The connection structure according to claim 1, wherein the shield-connecting terminal is crimp-connected only to the outer conductor.

17. A connection method for connecting a differential signal transmission cable to a circuit board, said method comprising:
preparing the differential signal transmission cable comprising an outer conductor provided around a pair of signal line conductors via an insulator;
exposing parts of the signal line conductors from a tip of the differential signal transmission cable;

preparing the circuit board comprising a pair of signal pads and a ground pad;
connecting a shield-connecting terminal comprising a solder-connecting pin to the outer conductor by crimping;
connecting the exposed parts of the signal line conductors to the signal pads by soldering; and
connecting the solder-connecting pin to the ground pad by soldering, thereby connecting the outer conductor to the ground pad via the solder-connecting pin of the shield-connecting terminal,
wherein the solder-connecting pin comprises two separate pins located to sandwich the signal line conductors, the two separate pins extending from an end of the outer conductor.

18. The connection method according to claim 17, wherein the connection of the exposed parts of the signal line conductors to the signal pads by soldering and the connection of the solder-connecting pin to the ground pad by soldering are carried out simultaneously.

19. The connection method according to claim 17, wherein the signal line conductors and the solder connecting pin are connected to a common surface of the circuit board.

* * * * *